(12) United States Patent
Nankawa et al.

(10) Patent No.: US 8,586,284 B2
(45) Date of Patent: Nov. 19, 2013

(54) PHOTOSENSITIVE RESIN COMPOSITION, PHOTOSENSITIVE ELEMENT, METHOD OF FORMING RESIST PATTERN, AND PROCESS FOR PRODUCING PRINTED WIRING BOARD

(75) Inventors: Hanako Nankawa, Hitachi (JP); Masahiro Miyasaka, Hitachi (JP); Yukiko Muramatsu, Hitachi (JP)

(73) Assignee: Hitachi Chemical Company, Ltd., Tokyo (JP)

(*) Notice: Subject to any disclaimer, the term of this patent is extended or adjusted under 35 U.S.C. 154(b) by 93 days.

(21) Appl. No.: 12/933,728

(22) PCT Filed: Jun. 10, 2008

(86) PCT No.: PCT/JP2008/060619
§ 371 (c)(1),
(2), (4) Date: Dec. 21, 2010

(87) PCT Pub. No.: WO2009/116182
PCT Pub. Date: Sep. 24, 2009

(65) Prior Publication Data
US 2011/0086309 A1    Apr. 14, 2011

(30) Foreign Application Priority Data
Mar. 21, 2008 (JP) ................. P2008-073874

(51) Int. Cl.
G03F 7/00 (2006.01)
G03F 7/004 (2006.01)
G03F 7/40 (2006.01)
G03F 7/027 (2006.01)

(52) U.S. Cl.
USPC ........... 430/281.1; 430/270.1; 430/311; 430/317; 430/319; 430/322; 430/331

(58) Field of Classification Search
USPC ........... 430/270.1, 281.1, 913, 311, 331, 317, 430/319, 322
See application file for complete search history.

(56) References Cited

U.S. PATENT DOCUMENTS

| 6,740,466 B1* | 5/2004 | Matsumoto et al. ....... 430/270.1 |
| 6,852,466 B2* | 2/2005 | Trefonas et al. .......... 430/270.1 |
| 6,878,505 B2* | 4/2005 | Shibuya et al. ........... 430/273.1 |

(Continued)

FOREIGN PATENT DOCUMENTS

| JP | 8-78318 | 3/1996 |
| JP | 11-327137 | 11/1999 |

(Continued)

OTHER PUBLICATIONS

Machine translation of JP 2006-145844 (no date).*

(Continued)

*Primary Examiner* — Amanda C. Walke
(74) *Attorney, Agent, or Firm* — Griffin & Szipl, P.C.

(57) ABSTRACT

The invention provides a photosensitive resin composition comprising (A) 100 parts by weight of a binder polymer having 10-65 parts by weight of a divalent group obtained from a specific styrene compound and its derivative, 5-55 parts by weight of a divalent group obtained from a specific (meth)acrylic acid ester and its derivative and 15-50 parts by weight of a divalent group obtained from (meth)acrylic acid, (B) a photopolymerizing compound and (C) a photopolymerization initiator.

8 Claims, 1 Drawing Sheet

(56) References Cited

U.S. PATENT DOCUMENTS

| | | | |
|---|---|---|---|
| 7,041,846 B2* | 5/2006 | Watanabe et al. | 560/128 |
| 7,087,691 B2* | 8/2006 | Rhodes et al. | 526/171 |
| 7,510,822 B2* | 3/2009 | Kodama | 430/313 |
| 7,771,912 B2* | 8/2010 | Yamamoto et al. | 430/270.1 |
| 8,017,304 B2* | 9/2011 | Tarutani et al. | 430/270.1 |
| 2005/0053862 A1* | 3/2005 | Kondo et al. | 430/270.1 |
| 2005/0221232 A1 | 10/2005 | Baldwin et al. | |
| 2007/0059636 A1* | 3/2007 | Kuroki | 430/270.1 |
| 2009/0053649 A1* | 2/2009 | Nakashima et al. | 430/285.1 |
| 2010/0028808 A1* | 2/2010 | Kubota | 430/286.1 |
| 2010/0148134 A1* | 6/2010 | Yoo | 252/586 |
| 2010/0159691 A1* | 6/2010 | Tsutsui | 438/613 |

FOREIGN PATENT DOCUMENTS

| | | |
|---|---|---|
| JP | 2004-004233 | 1/2004 |
| JP | 2005-122123 | 5/2005 |
| JP | 2006-131679 | 5/2006 |
| JP | 2006-162858 | 6/2006 |
| JP | 2006145844 A * | 6/2006 |
| JP | 2006-234995 | 9/2006 |
| JP | 2006-308701 | 11/2006 |
| JP | 2006-317698 | 11/2006 |
| JP | 2006-343709 | 12/2006 |
| JP | 2007-071914 A | 3/2007 |
| TW | 200617595 | 6/2006 |

OTHER PUBLICATIONS

Office action issued in counterpart Taiwanese application 097125112 on Mar. 15, 2012 (no translation available; submitted for certification).

Office Action issued in counterpart Korean application 10-2010-7017873 on Apr. 23, 2012 (no translation available; submitted for certification).

International Search Report issued in corresponding application No. PCT/JP2008/060619, completed Jul. 7, 2008 and mailed Jul. 15, 2008.

Office Action issued in counterpart Japanese application 2008-073874 on May 29, 2012 (no translation available; submitted for certification).

Office Action issued in counterpart Japanese application P2008-073874 on Oct. 23, 2012 (no translation available; submitted for certification).

* cited by examiner

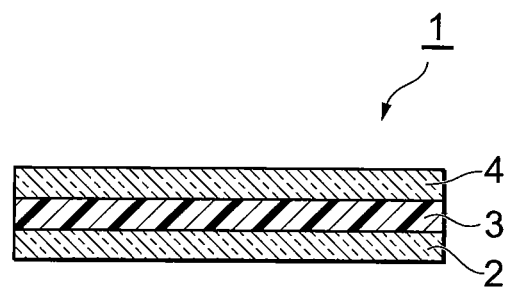

PHOTOSENSITIVE RESIN COMPOSITION, PHOTOSENSITIVE ELEMENT, METHOD OF FORMING RESIST PATTERN, AND PROCESS FOR PRODUCING PRINTED WIRING BOARD

This is a National Phase Application in the United States of International Patent Application No. PCT/JP2008/060619 filed Jun. 10, 2008, which claims priority on Japanese Patent Application No. P2007-073874, filed Mar. 21, 2008. The entire disclosures of the above patent applications are hereby incorporated by reference.

TECHNICAL FIELD

The present invention relates to a photosensitive resin composition, a photosensitive element, a method of forming a resist pattern and a method of producing a printed wiring board.

BACKGROUND ART

In the field of printed wiring board manufacturing, there are commonly employed photosensitive elements (laminated bodies) having a structure wherein a photosensitive resin composition or a layer comprising the photosensitive resin composition (hereinafter referred to as "photosensitive resin composition layer") is formed on a support film, as a resist material for etching or plating, and a protective film is situated on the photosensitive resin composition layer.

Printed wiring boards have conventionally been produced using such photosensitive elements, by the following procedure. Specifically, first the photosensitive resin composition layer of the photosensitive element is laminated onto a circuit-forming board such as a copper-clad laminate. The side of the photosensitive resin composition layer opposite (hereinafter referred to as the "upper side" of the photosensitive resin composition layer) from the side in contact with the support film (hereinafter referred to as the "lower side" of the photosensitive resin composition layer), is contact bonded to the side of the circuit-forming board on which the circuit is to be formed. Thus, when the protective film is positioned on the upper side of the photosensitive resin composition layer, the lamination operation is carried out while peeling off the protective film. The lamination is accomplished by thermocompression-bonding the photosensitive resin composition layer onto a ground layer circuit-forming board (ordinary pressure lamination).

The photosensitive resin composition layer is then subjected to pattern exposure through a mask film or the like. The support film is released at a timing of either before or after the exposure. The unexposed sections of the photosensitive resin composition layer are removed by dissolution or dispersion with a developing solution. Etching treatment or plating treatment is then performed to form a pattern, and finally the cured sections are peeled off.

The etching treatment referred to here is a method of etching removal of the metal surface of a circuit-forming board that is not covered with the cured resist formed after development, and then releasing the cured resist. Plating treatment, on the other hand, is a method that involves plating treatment with copper or solder on the metal surface of a circuit-forming board that is not covered with the cured resist formed after development, removing the cured resist and then etching the metal surface that has been covered by the resist.

Incidentally, the method for the pattern exposure may be a conventional method of using a mercury lamp as the light source for exposure through a photomask. In recent years, direct writing exposure has been proposed as a new DLP (Digital Light Processing) exposure technology, wherein the digital data of a pattern is directly drawn onto a photosensitive resin composition layer. Direct writing exposure has more satisfactory positioning precision than exposure through photomasks, while fine patterns can also be obtained, and it is therefore being introduced for formation of high-density package boards.

In pattern exposure, the exposure time must be shortened as much as possible to improve the production throughput. In the direct writing exposure mentioned above, a long exposure time will generally be necessary when using a composition with sensitivity comparable to that of a photosensitive resin composition used for conventional exposure through a photomask. It is therefore necessary to increase the illuminance on the exposure device side or increase the sensitivity of the photosensitive resin composition.

It is important for the photosensitive resin composition to have excellent resolution, resist release properties and adhesiveness, in addition to sensitivity. If the photosensitive resin composition can provide a resist pattern with excellent resolution and adhesiveness, it will be possible to sufficiently reduce short circuits and wire breaks. If the photosensitive resin composition is able to form a resist with an excellent release property, the shorter resist release time will improve the resist pattern forming efficiency, and a smaller size of the resist release strips will reduce resist release residue and improve the yield of circuit formation.

Photosensitive resin compositions employing specific binder polymers, photopolymerization initiators or the like and having excellent sensitivity, resolution and resist release properties, have been proposed to meet this need (see Patent documents 1 and 2, for example).

[Patent document 1] JP 2006-234995 A
[Patent document 2] JP 2005-122123 A

DISCLOSURE OF THE INVENTION

Problems to be Solved by the Invention

The photosensitive resin compositions described in Patent documents 1 and 2, however, have not been able to form resist patterns with fully satisfactory sensitivity, resolution and adhesiveness.

The present invention has been completed in light of the circumstances described above, and its object is to provide a photosensitive resin composition that forms resist patterns that are more satisfactory in terms of sensitivity, resolution and adhesiveness compared to the conventional art, as well as a photosensitive element, and a method of forming a resist pattern and a method of producing a printed wiring board, which employ the same.

Means for Solving the Problems

The present invention that achieves the object stated above provides a photosensitive resin composition comprising (A) 100 parts by weight of a binder polymer having 10-65 parts by weight of a divalent group represented by the following formula (I), 5-55 parts by weight of a divalent group represented by the following formula (II) and 15-50 parts by weight of a divalent group represented by the following formula (III), (B) a photopolymerizing compound, and (C) a photopolymerization initiator.

[Chemical Formula 1]

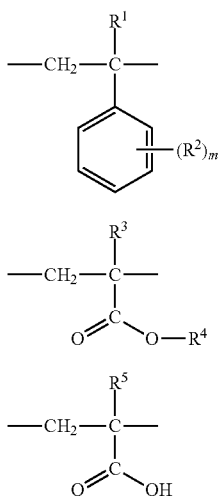

(I)

(II)

(III)

In formulas (I), (II) and (III), $R^1$, $R^3$ and $R^5$ each independently represent hydrogen or a methyl group, and $R^2$ represents C1-3 alkyl, C1-3 alkoxy, hydroxyl, amino or a halogen atom. $R^4$ represents an optionally substituted alicyclic hydrocarbon, optionally substituted aromatic hydrocarbon or optionally substituted heterocyclic group. The letter m represents an integer of 0-5, and when m is 2-5, the multiple $R^2$ groups may be the same or different.

Due to the combination of the aforementioned specified components in the photosensitive resin composition of the invention, the sensitivity is even more satisfactory than the prior art for formation of resist patterns by direct writing exposure, and it is also possible to form resist patterns with sufficient resolution and adhesiveness. The present inventors believe that the use of a binder polymer having the specific groups of component (A) is responsible for the aforementioned effect that is more satisfactory than the prior art in terms of sensitivity, resolution and adhesiveness.

The photosensitive resin composition of the invention also has a sufficient release property for the resist pattern that is to be formed from it. Using the photosensitive resin composition of the invention to form a resist pattern or printed wiring board can therefore help shorten the process and improve the product yield.

$R^4$ in the photosensitive resin composition is preferably a monovalent group represented by the following formula (IV), which will further improve the sensitivity, resolution and adhesiveness of the photosensitive resin composition.

[Chemical Formula 2]

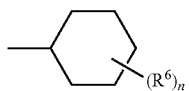

(IV)

In formula (IV), $R^6$ represents hydroxyl, C1-12 alkyl or C1-12 hydroxyalkyl. The letter n represents an integer of 0-5, and when n is 2-5, the multiple $R^6$ groups may be the same or different.

$R^4$ is preferably at least one type of group selected from the group consisting of monovalent groups represented by the following formulas (V), (VI), (VII) and (VIII) (hereinafter referred to as "(V)-(VIII)"). This can still further improve the sensitivity, resolution and adhesiveness of the photosensitive resin composition.

[Chemical Formula 3]

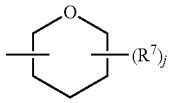

(V)

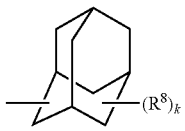

(VI)

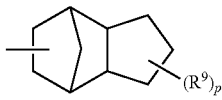

(VII)

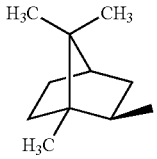

(VIII)

In formulas (V)-(VIII), $R^7$, $R^8$ and $R^9$ each independently represent hydroxyl, C1-12 alkyl or C1-12 hydroxyalkyl. The letter j represents an integer of 0-4, k and p represent integers of 0-9, and when j, k or p is 2 or greater the multiple $R^7$, $R^8$ or $R^9$ groups may be the same or different.

The photopolymerization initiator in the photosensitive resin composition of the invention preferably comprises a hexaarylbiimidazole derivative. This will increase the resolution and adhesiveness of the resist pattern while also improving the sludge removability.

The photosensitive resin composition of the invention preferably further comprises (D) a sensitizing dye. This will maximize absorption near a specific wavelength range, when exposure is accomplished with light having a peak in the specific wavelength range, and can further increase the sensitivity of the photosensitive resin composition.

The photosensitive resin composition of the invention preferably still further comprises (E) an amine-based compound. This can yet further increase the sensitivity of the photosensitive resin composition.

The invention also provides a photosensitive element comprising a support film and a photosensitive resin composition layer comprising the aforementioned photosensitive resin composition formed on the support film. Because this photosensitive element is provided with a photosensitive resin composition layer comprising the photosensitive resin composition, it is possible for resist pattern formation, even by direct writing exposure, to be accomplished with sufficient sensitivity, resolution and adhesiveness.

The invention still further provides a method of forming a resist pattern that comprises a lamination step in which a photosensitive resin composition layer comprising the aforementioned photosensitive resin composition is laminated on a circuit-forming board, an exposure step in which prescribed sections of the photosensitive resin composition layer are irradiated with active light rays for photocuring of the exposed sections, and a developing step in which the sections other than the exposed sections of the photosensitive resin composition layer are removed from the circuit-forming board on which the photosensitive resin composition layer has been formed. Since a photosensitive resin composition layer comprising the photosensitive resin composition is used to form the resist pattern according to this method of forming a resist pattern, a resist pattern with sufficient resolution and adhesiveness can be formed, even by direct writing exposure, with a short exposure time.

The present invention further provides a method of producing a printed wiring board comprising a step of etching or plating a circuit-forming board having a resist pattern formed by the aforementioned method of forming a resist pattern, to form a conductor pattern. According to this method of producing a printed wiring board, a circuit-forming board having a resist pattern formed by the aforementioned method of forming a resist pattern is used so that high-density wiring can be formed while allowing production of a printed wiring board with satisfactory minimization of wire breakage and shorts.

Effects of Invention

According to the invention it is possible to provide a photosensitive resin composition for formation of a resist pattern that is more satisfactory than the conventional art in terms of sensitivity, resolution and adhesiveness.

BRIEF DESCRIPTION OF THE DRAWINGS

FIG. 1 is a schematic cross-sectional view showing a preferred embodiment of a photosensitive element of the invention.

EXPLANATION OF SYMBOLS

1: Photosensitive element, 2: support film, 3: photosensitive resin composition layer, 4: protective film.

BEST MODES FOR CARRYING OUT THE INVENTION

Description of Embodiments

Preferred embodiments of the invention will now be explained in detail, with reference to the accompanying drawings as necessary. Throughout the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative. The term "(meth)acrylic acid" used in the present specification refers to "acrylic acid" and its corresponding "methacrylic acid", while "(meth)acrylate" refers to "acrylate" and its corresponding "methacrylate".

The photosensitive resin composition of the invention is a photosensitive resin composition comprising (A) a binder polymer having a divalent group (hereinafter referred to as "structural unit") represented by formula (I), a structural unit represented by formula (II) and a structural unit represented by formula (III), (B) a photopolymerizing compound, and (C) a photopolymerization initiator.

The binder polymer as component (A) will be explained first.

The binder polymer as component (A) comprises a structural unit based on styrene or its derivative represented by formula (I), a structural unit based on a (meth)acrylic acid ester represented by formula (II), and a structural unit based on (meth)acrylic acid represented by formula (III). This can result in excellent sensitivity of the photosensitive resin composition, while also providing satisfactory results in terms of the resolution of the photosensitive resin composition layer used as a structural material, as well as its adhesiveness and release property for circuit-forming boards.

In formula (I), $R^1$ represents hydrogen or a methyl group. $R^2$ represents C1-3 alkyl, C1-3 alkoxy, hydroxyl, amino or a halogen atom. The letter m represents an integer of 0-5.

The structural unit represented by formula (I) is obtained from styrene or its derivative, as a polymerizable monomer. Specific examples of styrene derivatives include methylstyrene, ethylstyrene, hydroxystyrene, butoxystyrene, chlorostyrene, bromostyrene and amino styrene.

In formula (II), $R^3$ represents hydrogen or a methyl group. $R^4$ represents an optionally substituted alicyclic hydrocarbon, optionally substituted aromatic hydrocarbon or optionally substituted heterocyclic group.

Examples of alicyclic hydrocarbon groups include groups or their derivatives having one cyclic hydrocarbon group, such as cyclobutyl, cyclopentyl, cyclohexyl and cycloheptyl, and groups or their derivatives having two or more cyclic hydrocarbons, such as dicyclopentanyl, dicyclopentenyl, adamantyl and isobornyl.

Examples of aromatic hydrocarbon groups include groups or their derivatives having an aromatic ring such as phenyl, biphenyl, triphenylmethyl, naphthyl, anthracenyl, tetracenyl, phenanthrenyl or pyrenyl.

Examples of heterocyclic groups include groups with aliphatic heterocyclic rings such as tetrahydropyranyl, piperidinyl, piperazinyl and morpholinyl, or their derivatives, and groups with aromatic heterocyclic rings such as pyranyl, pyridinyl, pyrimidinyl, furanyl, thienyl, pyrazole, pyrrole, imidazole, oxazole and thiazole, or their derivatives.

From the viewpoint of further improving the sensitivity, resolution and adhesiveness of the photosensitive resin composition, $R^4$ is preferably an optionally substituted alicyclic hydrocarbon group or optionally substituted aliphatic heterocyclic group.

From the viewpoint of still further improving the sensitivity, resolution and adhesiveness of the photosensitive resin composition, $R^4$ is more preferably a group represented by formula (IV) above.

In formula (IV), $R^6$ represents hydroxyl, C1-12 alkyl or C1-12 hydroxyalkyl. The letter n represents an integer of 0-5, and when n is 2-5, the multiple $R^6$ groups may be the same or different.

From the viewpoint of more reliably and effectively obtaining the effect of the invention, $R^6$ is preferably hydroxyl, C1-5 alkyl or C1-5 hydroxyalkyl, more preferably C1-3 alkyl or C1-3 hydroxyalkyl, and even more preferably hydroxyl, methyl or hydroxymethyl. The letter n is preferably 0-3 and more preferably 0-2.

When $R^4$ in formula (II) is a group represented by formula (IV), the structural unit is obtained from cyclohexyl (meth)acrylate or its derivative as the polymerizable monomer. Specific examples of cyclohexyl (meth)acrylate derivatives include methylcyclohexyl (meth)acrylate, dimethylcyclohexyl (meth)acrylate, trimethylcyclohexyl (meth)acrylate, hydroxycyclohexyl (meth)acrylate and methylhydroxycyclohexyl (meth)acrylate.

From the viewpoint of even still further improving the sensitivity, resolution and adhesiveness of the photosensitive resin composition, $R^4$ is preferably at least one group selected from the group consisting of monovalent groups represented by formulas (V)-(VIII).

In formulas (V)-(VIII), $R^7$, $R^8$ and $R^9$ each independently represent hydroxyl, C1-12 alkyl or C1-12 hydroxyalkyl. The letter j represents an integer of 0-4, and k and p represent integers of 0-9. When j, k or p is 2 or greater, the multiple $R^7$, $R^8$ or $R^9$ groups may be the same or different.

From the viewpoint of even more reliably and effectively obtaining the effect of the invention, $R^7$, $R^8$ and $R^9$ are each preferably hydroxyl, C1-5 alkyl or C1-5 hydroxyalkyl, more preferably C1-3 alkyl or C1-3 hydroxyalkyl, and even more preferably hydroxyl, methyl or hydroxymethyl. The letter j is preferably 0-2. The letters k and p are preferably 0-5 and more preferably 0-2.

When $R^4$ in formula (II) is a group represented by formula (V), the structural unit is obtained from tetrahydropyranyl (meth)acrylate or its derivative as the polymerizable monomer. When $R^4$ is a group represented by formula (VI), the structural unit is obtained from adamantyl (meth)acrylate or its derivative as the polymerizable monomer. When $R^4$ is a group represented by formula (VII), the structural unit is obtained from dicyclopentanyl (meth)acrylate or its derivative as the polymerizable monomer. When $R^4$ is a group represented by formula (VIII), the structural unit is obtained from isobornyl (meth)acrylate or its derivative as the polymerizable monomer.

From the viewpoint of still further improving the sensitivity, resolution and adhesiveness of the photosensitive resin composition, $R^4$ is most preferably a monovalent group represented by formula (IV) above.

In formula (III), $R^5$ represents hydrogen or a methyl group, and specifically formula (III) is a structural unit based on acrylic acid or methacrylic acid.

The content ratio of the structural unit represented by formula (I) in component (A) is 10-65 parts by weight, preferably 15-55 parts by weight, more preferably 20-50 parts by weight and even more preferably 25-45 parts by weight with respect to 100 parts by weight as the total of component (A). This will result in more excellent adhesiveness and improved release property of the resist pattern. If the content ratio is less than 10 parts by weight the adhesiveness will tend to be insufficient, while if it is greater than 65 parts by weight the release property will tend to be impaired.

The content ratio of the structural unit represented by formula (II) in component (A) is 5-55 parts by weight, preferably 10-50 parts by weight, more preferably 15-45 parts by weight and even more preferably 20-40 parts by weight, with respect to 100 parts by weight as the total of component (A). This will result in more excellent adhesiveness and improved release property of the resist pattern. If the content ratio is less than 5 parts by weight the adhesiveness will tend to be insufficient, while if it is greater than 55 parts by weight the release property will tend to be impaired.

The content ratio of the structural unit represented by formula (III) in component (A) is 15-50 parts by weight, preferably 20-45 parts by weight, more preferably 25-40 parts by weight and even more preferably 27-35 parts by weight, with respect to 100 parts by weight as the total of component (A). This will result in even more satisfactory release and developing properties of the resist pattern. If the content ratio is less than 15 parts by weight the alkaline solubility of the resist pattern will tend to be reduced, while the release strips will tend to be larger and the release time will tend to be longer. A content ratio exceeding 50 parts by weight will tend to result in inadequate resolution. The structural unit represented by formula (III) is obtained from (meth)acrylic acid as the polymerizable monomer.

The term "styrene derivative" according to the invention means styrene wherein a hydrogen in the phenyl group has been replaced with a substituent (an organic group such as alkyl, a hydroxyl group, a halogen atom, or the like). The term "cyclohexyl (meth)acrylate derivative" means cyclohexyl (meth)acrylate wherein a hydrogen of the cyclohexyl group has been replaced with a substituent (a C1-12 alkyl or C1-12 hydroxyalkyl group).

When the binder polymer is used to form a photosensitive resin composition layer, a single binder polymer may be used alone, or two or more binder polymers may be used in any desired combinations. Examples of binder polymers employing combinations of two or more types include two or more binder polymers composed of different copolymerizing components (including those with different repeating units as the constituent components), two or more binder polymers with different weight-average molecular weights, and two or more binder polymers with different dispersities. There may also be used a polymer having a multimode molecular weight distribution, as described in JP 11-327137 A.

The weight-average molecular weight (Mw) and number-average molecular weight (Mn) of the (A) binder polymer may be measured by gel permeation chromatography (GPC) (calculated with a calibration curve using standard polystyrene). Based on this manner of measurement, the Mw of the binder polymer is preferably 5000-300000, more preferably 10000-150000 and most preferably 20000-80000. An Mw value of less than 5000 will tend to result in lower developing solution resistance, and a value of greater than 300000 will tend to lengthen the developing time.

The (A) binder polymer has a dispersity (Mw/Mn) of preferably 1.0-3.0 and more preferably 1.0-2.0. A dispersity of greater than 3.0 will tend to lower the adhesiveness and resolution.

The binder polymer of the invention may be produced, for example, by radical polymerization of the aforementioned polymerizable monomer.

The (A) binder polymer may also comprise a structural unit other than the structural units represented by formulas (I)-(III). In this case, the polymerizable monomer that supplies a structural unit other than the structural units represented by formulas (I)-(III) may be, for example, an acrylamide such as diacetoneacrylamide, an acrylonitrile, a vinyl alcohol ester such as vinyl-n-butyl ether, an alkyl (meth)acrylate ester, tetrahydrofurfuryl (meth)acrylate ester, dimethylaminoethyl (meth)acrylate ester, diethylaminoethyl (meth)acrylate ester, glycidyl (meth)acrylate ester, 2,2,2-trifluoroethyl (meth)acrylate, 2,2,3,3-tetrafluoropropyl (meth)acrylate, α-bromo (meth)acrylic acid, α-chlor(meth)acrylic acid, β-furyl(meth)acrylic acid, β-styryl(meth)acrylic acid, maleic acid, maleic anhydride, a maleic acid monoester such as monomethyl malate, monoethyl malate or monoisopropyl malate, fumaric acid, cinnamic acid, α-cyanocinnamic acid, itaconic acid, crotonic acid, or propiolic acid. These may be used alone or in combinations of two or more.

Examples of alkyl (meth)acrylate esters include compounds represented by the following formula (IX), and the same compounds with the alkyl groups substituted with hydroxyl groups, epoxy groups, halogen atoms or the like.

$$CH_2=C(R^{10})-COOR^{11} \qquad (IX)$$

In formula (IX), $R^{10}$ represents hydrogen or a methyl group, and $R^{11}$ represents a C1-12 alkyl group. Examples of C1-12 alkyl groups represented by $R^{11}$ include methyl, ethyl, propyl, butyl, pentyl, hexyl, heptyl, octyl, nonyl, decyl, undecyl, dodecyl and their structural isomers. Examples of polymerizable monomers represented by formula (IX) include methyl (meth)acrylate ester, ethyl (meth)acrylate ester, propyl (meth)acrylate ester, butyl (meth)acrylate ester, pentyl (meth)acrylate ester, hexyl (meth)acrylate ester, heptyl (meth)acrylate ester, octyl (meth)acrylate ester, 2-ethylhexyl (meth)acrylate ester, nonyl (meth)acrylate ester, decyl (meth) acrylate ester, undecyl (meth)acrylate ester and dodecyl (meth)acrylate ester. These polymerizable monomers may be used alone or in combinations of two or more.

The content ratio of the structural unit other than structural units represented by formulas (I)-(III) in component (A) is not particularly restricted, so long as it is in a range that allows the object of the invention to be achieved. However, the content ratio is preferably 0-40 parts by weight, more preferably 0-20 parts by weight and most preferably 0-10 parts by weight with respect to 100 parts by weight as the total of component (A).

The (A) binder polymer used according to the invention preferably consists of one or more polymers with carboxyl groups, from the viewpoint of the developing property when the alkali solution is used for alkali development. Such a binder polymer (A) may be obtained, for example, by radical polymerization of a carboxyl group-containing polymerizable monomer with another polymerizable monomer.

The acid value of the (A) binder polymer is preferably 30-220 mgKOH/g, more preferably 50-200 mgKOH/g and even more preferably 80-180 mgKOH/g. If the acid value is less than 30 mgKOH/g the developing time will tend to be longer, and if it is greater than 220 mgKOH/g the developing solution resistance of the photocured resist will tend to be reduced. When solvent development is carried out as the developing step, it is preferred to adjust the carboxyl group-containing polymerizable monomer to a smaller amount.

The (A) binder polymer may contain special groups with photosensitivity in the molecule if necessary.

The content of component (A) in the photosensitive resin composition of the invention is preferably 30-70 parts by weight, more preferably 35-65 parts by weight and even more preferably 40-60 parts by weight, with respect to 100 parts by weight as the total of component (A) and component (B). A content of less than 30 parts by weight will tend to interfere with obtaining a satisfactory resist pattern shape, while a content of greater than 70 parts by weight will tend to interfere with obtaining satisfactory sensitivity and resolution. Component (A) may be a single type or a combination of two or more types.

The photosensitive resin composition of the invention may contain a resin other than component (A), within limits that allow the object of the invention to be achieved. Examples of such resins include acrylic-based resins, styrene-based resins, epoxy-based resins, amide-based resins, amide-epoxy-based resins, alkyd-based resins and phenol-based resins. Acrylic-based resins are preferred from the viewpoint of the alkali developing property. These resins may also be used alone or in combinations of two or more.

The photopolymerizing compound as component (B) will now be described.

The photopolymerizing compound as component (B) may be, for example, a compound obtained by reacting an α,β-unsaturated carboxylic acid with a polyhydric alcohol, a bisphenol A-based (meth)acrylate compound, a compound obtained by reacting an α,β-unsaturated carboxylic acid with a glycidyl group-containing compound, a urethane monomer such as a (meth)acrylate compound with an urethane bond in the molecule, nonylphenoxypolyethylene oxyacrylate, a phthalic acid-based compound, or a (meth)acrylic acid alkyl ester. These compounds may be used alone or in combinations of two or more different compounds.

Examples of compounds obtained by reacting an α,β-unsaturated carboxylic acid with a polyhydric alcohol include polyethyleneglycol di(meth)acrylates with 2-14 ethylene groups, polypropyleneglycol di(meth)acrylates with 2-14 propylene groups, polyethylene-polypropyleneglycol di(meth)acrylates with 2-14 ethylene groups and 2-14 propylene groups, trimethylolpropane di(meth)acrylate, trimethylolpropane tri(meth)acrylate, EO-modified trimethylolpropane tri(meth)acrylate, PO-modified trimethylolpropane tri (meth)acrylate, EO,PO-modified trimethylolpropane tri (meth)acrylate, tetramethylolmethane tri(meth)acrylate, tetramethylolmethane tetra(meth)acrylate, dipentaerythritol penta(meth)acrylate and dipentaerythritol hexa(meth)acrylate. These compounds may be used alone or in combinations of two or more different ones. "EO" stands for ethylene oxide, and an EO-modified compound has a block structure of ethylene oxide groups. "PO" stands for propylene oxide, and a PO-modified compound has a block structure of propylene oxide groups.

Examples of bisphenol A-based (meth)acrylate compounds include 2,2-bis(4-((meth)acryloxypolyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes.

Examples of 2,2-bis(4-((meth)acryloxypolyethoxy)phenyl)propanes include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane.

2,2-bis(4-(methacryloxypentaethoxy)phenyl)propane is commercially available as BPE-500 (trade name of Shin-Nakamura Chemical Co., Ltd.) or FA-321 M (trade name of Hitachi Chemical Co., Ltd.), and 2,2-bis(4-(methacryloxypentadecaethoxy)phenyl)propane is commercially available as BPE-1300 (trade name of Shin-Nakamura Chemical Co., Ltd.). The number of ethylene oxide groups in each molecule of a 2,2-bis(4-((meth)acryloxypolyethoxy)phenyl)propane is preferably 4-20 and more preferably 8-15. These compounds may be used alone or in combinations of two or more different ones.

Examples of (meth)acrylate compounds having urethane bonds in the molecule include addition reaction products of (meth)acrylic monomers with a hydroxyl group at the β position and diisocyanate compounds (isophorone diisocyanate, 2,6-toluene diisocyanate, 2,4-toluene diisocyanate, 1,6-hexamethylene diisocyanate and the like), as well as tris((meth)acryloxytetraethyleneglycol isocyanate)hexamethylene isocyanurate, EO-modified urethane di(meth)acrylate and EO,PO-modified urethane di(meth)acrylate. An example of an EO-modified urethane di(meth)acrylate compound is UA-11 (trade name of Shin-Nakamura Chemical Co., Ltd.).

An example of an EO,PO-modified urethane di(meth)acrylate compound is UA-13 (trade name of Shin-Nakamura Chemical Co., Ltd.). These compounds may be used alone or in combinations of two or more different compounds.

Examples of nonylphenoxypolyethylene oxyacrylates include nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate and nonylphenoxyundecaethylene oxyacrylate. These compounds may be used alone or in combinations of two or more different compounds.

Examples of phthalic acid-based compounds include γ-chloro-β-hydroxypropyl-β'-(meth)acryloyloxyethyl-o-phthalate or β-hydroxyalkyl-β'-(meth)acryloyloxyalkyl-o-phthalate. Such phthalic acid-based compounds are commercially available as, for example, FA-MECH (trade name of Hitachi Chemical Co., Ltd.). These compounds may be used alone or in combinations of two or more different compounds.

From the viewpoint of improving the plating resistance and adhesiveness, component (B) of the invention preferably includes a bisphenol A-based (meth)acrylate compound or a (meth)acrylate compound containing a urethane bond in the molecule. From the viewpoint of improving the sensitivity and resolution, it preferably includes a bisphenol A-based (meth)acrylate compound.

Component (B) of the invention preferably also contains a polyalkyleneglycol di(meth)acrylate having both an ethylene glycol chain and a propylene glycol chain in the molecule, from the viewpoint of improving the flexibility of the cured film. The (meth)acrylate is not particularly restricted so long as it has both an ethylene glycol chain and a propylene glycol chain (n-propylene glycol chain or isopropylene glycol chain) as alkylene glycol chains in the molecule. The (meth)acrylate may further comprise an n-butylene glycol chain, an isobutylene glycol chain, an n-pentylene glycol chain or a hexylene glycol chain, or an approximately C4-6 alkylene glycol chain which is a structural isomer of the foregoing.

When a plurality of ethylene glycol chains and propylene glycol chains are present, the plurality of ethylene glycol chains and propylene glycol chains do not need to be arranged continuously in a block manner but may be random. Also, the secondary carbon of the propylene group in the isopropylene glycol chain may be bonded to an oxygen atom, or the primary carbon may be bonded to an oxygen atom.

Examples of polyalkyleneglycol di(meth)acrylates having both an ethylene glycol chain and a propylene glycol chain in the molecule in component (B) include compounds represented by the following formulas (X), (XI) and (XII).

[Chemical Formula 4]

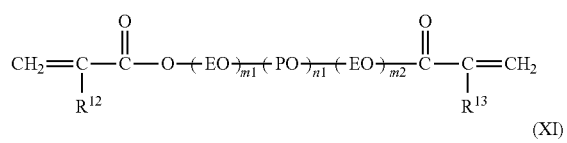

(X)

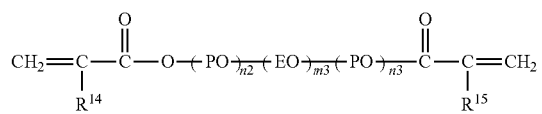

(XI)

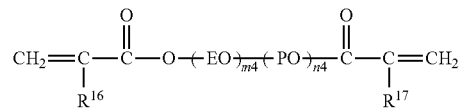

(XII)

In formulas (X), (XI) and (XII), $R^{12}$, $R^{13}$, $R^{14}$, $R^{15}$, $R^{16}$ and $R^{17}$ each independently represent hydrogen or a C1-3 alkyl group. EO represents the ethylene glycol chain, and PO represents the propylene glycol chain. The denotations m1-m4 and n1-n4 each independently represent an integer of 1-30. These compounds may be used alone or in combinations of two or more different compounds.

Examples of C1-3 alkyl groups for formulas (X), (XI) and (XII) include methyl, ethyl, n-propyl and i-propyl.

The total numbers of repeating ethylene glycol chains in formulas (X), (XI) and (XII) (m1+m2, m3 and m4) are each independently preferably an integer of 1-30, more preferably an integer of 1-10, even more preferably an integer of 4-9 and most preferably an integer of 5-8. If the number of repeats exceeds 30, the tent reliability and resist shape will tend to be poor.

The total numbers of repeating propylene glycol chains in formulas (X), (XI) and (XII) (n1, n2+n3 and n4) are each independently preferably an integer of 1-30, more preferably an integer of 5-20, even more preferably an integer of 8-16 and most preferably an integer of 10-14. If the number of repeats exceeds 30, the resolution will be poor and sludge will tend to be produced.

Specific examples of compounds represented by formula (X) include vinyl compounds wherein $R^{12}=R^{13}$=methyl, m1+m2=4 (average value) and n1=12 (average value) (FA-023M, trade name of Hitachi Chemical Co., Ltd.). Specific examples of compounds represented by formula (XI) include vinyl compounds wherein $R^{14}=R^{15}$=methyl, m3=6 (average value) and n2+n3=12 (average value) (FA-024M, trade name of Hitachi Chemical Co., Ltd.). Specific examples of compounds represented by formula (XII) include vinyl compounds wherein $R^{16}=R^{17}$=hydrogen, m4=1 (average value) and n4=9 (average value) (NK ESTER HEMA-9P, trade name of Shin-Nakamura Chemical Co., Ltd.). These compounds may be used alone or in combinations of two or more different compounds.

Of the photopolymerizing compounds mentioned above, component (B) is most preferably a combination of two different compounds having two photopolymerizable bonds in the same molecule, and one compound having a photopolymerizable bond in the molecule. When component (B) is a (meth)acrylate compound, for example, it is most preferably a combination of two different (meth)acrylate compounds having two (meth)acrylic groups in the same molecule, and one (meth)acrylate compound having a (meth)acrylic group in the molecule.

This can improve the balance between the properties of photosensitivity, adhesiveness, resolution and releasability.

The content of the photopolymerizing compound in component (B) is preferably 30-70 parts by weight, more preferably 35-65 parts by weight and most preferably 40-60 parts by weight with respect to 100 parts by weight as the total of component (A) and component (B). A content of less than 30 parts by weight will tend to prevent satisfactory sensitivity and resolution from being obtained, while a content of greater than 70 parts by weight will tend to prevent a satisfactory pattern shape from being obtained. Component (B) may be a single type or a combination of two or more types.

The photopolymerization initiator as component (C) will now be described.

Examples for the photopolymerization initiator as component (C) include aromatic ketones such as 4,4'-bis(diethylamino)benzophenone, benzophenone 2-benzyl-2-dimethylamino-1-(4-morpholinophenyl)-butanone-1 and 2-methyl-1-[4-(methylthio)phenyl]-2-morpholino-propanone-1, quinones such as alkylanthraquinone, benzoinether compounds such as benzoinalkyl ether, benzoin compounds such as benzoin and alkylbenzoin, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, and acridine derivatives such as 9-phenylacridine and 1,7-bis(9,9'-acridinyl)heptane.

The aryl substituents of the two 2,4,5-triarylimidazoles in a 2,4,5-triarylimidazole dimer may be identical to constitute a symmetrical compound, or they may be different to constitute an asymmetrical compound. The photopolymerization initiator is preferably a hexaarylbiimidazole derivative as the 2,4,5-triarylimidazole dimer, from the viewpoint of adhesiveness and sensitivity. These photopolymerization initiators may be used as single compounds or as combinations of two or more compounds.

The content of the photopolymerization initiator as component (C) is preferably 0.1-10 parts by weight, more preferably 2-6 parts by weight and most preferably 3.5-5 parts by weight, with respect to 100 parts by weight as the total of component (A) and component (B). A content of less than 0.1 part by weight will tend to interfere with obtaining satisfactory sensitivity and resolution, while a content of greater than 10 parts by weight will tend to interfere with obtaining a resist pattern with a satisfactory desired shape. The photopolymerization initiator as component (C) may be a single type or a combination of two or more types.

The photosensitive resin composition of the invention preferably comprises (D) a sensitizing dye and/or (E) an amine-based compound, in addition to components (A) to (C) described above.

The sensitizing dye as component (D) according to the invention allows more effective utilization of the absorption wavelength of the active light rays used for exposure, and is preferably a compound with a maximum absorption wavelength of 370-420 nm. Using such a sensitizing dye according to the invention can provide sufficiently high sensitivity for exposure light in direct writing exposure methods. If the maximum absorption wavelength of the sensitizing dye is less than 370 nm the sensitivity for direct writing exposure light will tend to be reduced, and if it is greater than 420 nm, the stability in yellow light environments will tend to be lower.

Examples of sensitizing dyes include pyrazolines, anthracenes, coumarins, xanthones, oxazoles, benzoxazoles, thiazoles, benzothiazoles, triazoles, stilbenes, triazines, thiophenes and naphthalimides. The sensitizing dye preferably comprises an anthracene from the viewpoint of improving the resolution, adhesiveness and sensitivity.

The sensitizing dye content is preferably 0.01-10 parts by weight, more preferably 0.05-5 parts by weight and even more preferably 0.1-2 parts by weight, with respect to 100 parts by weight as the total of component (A) and component (B). A content of less than 0.01 part by weight will tend to prevent satisfactory sensitivity and resolution from being obtained, while a content of greater than 10 parts by weight will tend to prevent a resist pattern with a satisfactory desired shape from being obtained. The sensitizing dye as component (D) may be a single type or a combination of two or more types.

The amine-based compound as component (E) is not particularly restricted so long as it is a compound with an amino group in the molecule, and it can increase the sensitivity of the photosensitive resin composition. Specific examples include bis[4-(dimethylamino)phenyl]methane, bis[4-(diethylamino)phenyl]methane and leuco crystal violet.

The amine-based compound content is preferably 0.01-10 parts by weight, more preferably 0.05-5 parts by weight and even more preferably 0.1-2 parts by weight, with respect to 100 parts by weight as the total of component (A) and component (B). A content of less than 0.01 part by weight will tend to prevent satisfactory sensitivity from being obtained, while a content of greater than 10 parts by weight will tend to cause deposition of component (E) as a contaminant after film formation. The amine-based compound as component (E) may be a single type or a combination of two or more types.

The photosensitive resin composition of the invention may also contain, if necessary, photopolymerizing compounds with at least one cationic polymerizable cyclic ether group in the molecule (oxetane compounds, etc.), cationic polymerization initiators, dyes such as malachite green, photochromic agents such as tribromophenylsulfone and leuco crystal violet, thermal development inhibitors, plasticizers such as p-toluenesulfonamide, pigments, fillers, antifoaming agents, flame retardants, stabilizers, tackifiers, leveling agents, release promoters, antioxidants, aromas, imaging agents and thermal crosslinking agents. Such components may be used at about 0.01-20 parts by weight with respect to 100 parts by weight as the total of component (A) and component (B). These may be used alone or in combinations of two or more types.

The photosensitive resin composition of the invention may be used as a solution in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, at a solid content of about 30-60 wt %. The solution may be used as a coating solution for formation of a photosensitive resin composition layer on a photosensitive element.

The coating solution may be used to form the photosensitive resin composition layer of a photosensitive element, but it may also be coated as a liquid resist onto the surface of a metal sheet and dried, and then covered with a protective film. The material of the metal sheet may be, for example, copper, a copper-based alloy, nickel, chromium, iron or an iron-based alloy such as stainless steel, and is preferably copper, a copper-based alloy or an iron-based alloy.

A photosensitive element according to the invention will now be explained. FIG. 1 is a schematic cross-sectional view showing a preferred embodiment of a photosensitive element of the invention. The photosensitive element 1 shown in FIG. 1 is composed of a support film 2, a photosensitive resin composition layer 3 comprising the photosensitive resin composition formed on the support film 2, and a protective film 4 laminated on the photosensitive resin composition layer 3.

The support film 2 may be a polymer film having heat resistance and solvent resistance, such as polyethylene terephthalate, polypropylene, polyethylene or polyester, for example. Examples of commercially available products include ALPHAN MA-410 and E-200C (trade names) by Oji Paper Co., Ltd., polypropylene films by Shin-Etsu Film Co., Ltd., and polyethylene terephthalate films such as the PS Series (for example, trade name: PS-25) by Teijin, Ltd., although there is no restriction to these.

The support film 2 has a thickness of preferably 1-100 μm and more preferably 5-25 μm. If the thickness is less than 1 μm the support film will be prone to tearing during its release before development, and if it is greater than 100 μm the resolution will tend to be reduced. Incidentally, one support film 2 may be used as the support for the photosensitive resin composition layer, while another is used as a protective film for the photosensitive resin composition, thus being laminated on both sides of the photosensitive resin composition layer.

The photosensitive resin composition layer 3 is preferably formed by dissolving the photosensitive resin composition in a solvent as described above to make a solution (coating solution) with a solid content of about 30-60 wt % and then applying the solution onto the support film 2 and drying it. The coating may be accomplished by a publicly known method using, for example, a roll coater, comma coater, gravure coater, air knife coater, die coater, bar coater or the like. The drying may be carried out at 70-150° C. for about 5-30 minutes. The amount of residual organic solvent in the photosensitive resin composition is preferably no greater than 2 wt % from the viewpoint of preventing diffusion of the organic solvent in subsequent steps.

The thickness of the photosensitive resin composition layer 3 will differ depending on the purpose of use of the photosensitive element, but the post-drying thickness is preferably 1-100 μm and more preferably 1-50 μm. A thickness of less than 1 μm will tend to hamper industrial coating, while a thickness of greater than 100 μm will tend to reduce the effect of the invention and lower the adhesive force and resolution.

The photosensitive resin composition layer 3 preferably has a transmittance of 5-75%, more preferably 7-60% and most preferably 10-40%, for light with a wavelength of 365 nm or 405 nm. A transmittance of less than 5% will tend to result in inferior adhesiveness, while a transmittance of greater than 75% will tend to result in inferior resolution. The transmittance may be measured by a UV spectrometer, and the UV spectrometer may be a Model 228A W Beam Spectrophotometer (trade name) by Hitachi, Ltd.

The protective film 4 is preferably one such that the adhesive force between the photosensitive resin composition layer 3 and the protective film 4 is lower than the adhesive force between the photosensitive resin composition layer 3 and the support film 2, and it is also preferably a low-fisheye film. "Fisheyes" are contaminants, insoluble matter and oxidative degradation products that become incorporated into films during their production by heat-fusion, kneading, extrusion, biaxial stretching and casting of film materials.

The protective film 4 may be a polymer film having heat resistance and solvent resistance, such as polyethylene terephthalate, polypropylene, polyethylene or polyester, for example. Examples of commercially available products include ALPHAN MA-410 and E-200C (trade names) by Oji Paper Co., Ltd., polypropylene films by Shin-Etsu Film Co., Ltd., and polyethylene terephthalate films such as the PS Series (for example, trade name: PS-25) by Teijin, Ltd., although there is no restriction to these.

The thickness of the protective film 4 is preferably 1-100 μm, more preferably 5-50 μm, even more preferably 5-30 μm and most preferably 15-30 μm. If the thickness is less than 1 μm the protective film will tend to tear during lamination, while if it is greater than 100 μm the cost of the film will be increased.

The photosensitive element 1 of the invention may also comprise interlayers such as a cushion layer, adhesive layer, photoabsorbing layer and gas barrier layer as necessary. The obtained photosensitive element 1 may be stored as a sheet or as a roll wound up on a winding core. In the latter case, it is preferably wound with the support film 1 on the outermost side. An edge separator is preferably situated at the end face of the photosensitive element roll from the viewpoint of end face protection, while from the viewpoint of preventing end face fusion, the end face separator is preferably moisture-proof. The packaging method is preferably one that involves bundling in a black sheet with low moisture permeability. The winding core may be, for example, a plastic such as polyethylene resin, polypropylene resin, polystyrene resin, polyvinyl chloride resin or ABS resin (acrylonitrile-butadiene-styrene copolymer).

A method of forming a resist pattern according to the invention will now be explained.

The method of forming a resist pattern according to the invention comprises at least a lamination step in which a photosensitive resin composition layer comprising the photosensitive resin composition described above is laminated on a circuit-forming board, an exposure step in which prescribed sections of the photosensitive resin composition layer are irradiated with active light rays for photocuring of the exposed sections, and a developing step in which the sections of the photosensitive resin composition other than the exposed sections are removed from the circuit-forming board. A "circuit-forming board" is a board comprising an insulating layer and a conductive layer formed on the insulating layer. The circuit-forming board may be multilayered with wiring in the interior, and it may also have small through-holes.

The method of laminating the photosensitive resin composition layer on the circuit-forming board in the lamination step may be the following method. First, the protective film is slowly released from the photosensitive resin composition layer, while the section of the photosensitive resin composition layer surface that becomes gradually exposed thereby is attached to the surface of the circuit-forming board on which the circuit is to be formed. The photosensitive resin composition layer is contact bonded onto the circuit-forming board while heating the photosensitive resin composition layer, for lamination. The laminating procedure is preferably carried out under reduced pressure from the viewpoint of improving the adhesiveness and follow-up property. For lamination of the photosensitive element, the photosensitive resin composition layer and/or circuit-forming board is preferably heated to 70-130° C. and the contact bonding pressure is preferably about 0.1-1.0 MPa (about 1-10 kgf/cm$^2$), although there is no particular restriction to these conditions. If the photosensitive resin composition layer is heated at 70-130° C. as mentioned above it is not necessary to subject the circuit-forming board to preheating beforehand, but the circuit-forming board may nevertheless be preheated for further enhanced laminating properties.

The method of forming the exposed sections in the exposure step may be a method of irradiation with active light rays into an image form, through a negative or positive mask pattern known as artwork (mask exposure method). When the support film on the photosensitive resin composition layer transmits active light rays, the active light rays may be irradiated through the support film, and when the support film is non-transparent, the active light rays may be irradiated onto the photosensitive resin composition layer after removal of the support film. The active light rays may also be irradiated into an image by a direct writing exposure method such as laser direct writing exposure or DLP (Digital Light Processing) exposure.

The light source for the active light rays may be a known light source such as a carbon arc lamp, mercury vapor arc lamp, high-pressure mercury lamp, xenon lamp or a gas laser such as an argon laser, a solid laser such as a YAG laser, or an effective emitter of ultraviolet rays such as a semiconductor laser, or visible light.

The method for removing the sections other than the exposed sections in the developing step, when a support film is present on the photosensitive resin composition layer, may be a method in which the support film is first removed and then the sections other than the exposed sections are removed by development such as wet development, dry development or the like. This procedure results in formation of a resist pattern.

In the case of wet development, a developing solution suitable for photosensitive resin compositions may be used, such as an aqueous alkali solution, aqueous developing solution or organic solvent-based developing solution, and development may be accomplished by a publicly known method employing a dip system, a paddle system, a spray system, reciprocal dipping, brushing, scrapping or the like. The developing system is most optimally a high-pressure spray system, for improved resolution. Two or more different developing methods may also be carried out in combination if necessary.

The developing solution used may be an aqueous alkali solution, which is safe and stable and easily manageable. As bases for the aqueous alkali solution there may be used, for example, alkali hydroxides such as hydroxides of lithium, sodium, potassium and the like, alkali carbonates such as carbonates or bicarbonates of lithium, sodium, potassium, ammonium and the like, alkali metal phosphates such as potassium phosphate and sodium phosphate, alkali metal pyrophosphates such as sodium pyrophosphate and potassium pyrophosphate, and borax.

The aqueous alkali solution used for development is preferably a 0.1-5 wt % sodium carbonate dilute solution, a 0.1-5 wt % potassium carbonate dilute solution, a 0.1-5 wt % sodium hydroxide dilute solution or a 0.1-5 wt % sodium tetraborate (borax) dilute solution. The pH of the aqueous alkali solution is preferably in the range of 9-11, and the temperature is adjusted as appropriate for the developing property of the photosensitive resin composition layer. The aqueous alkali solution may also contain added surfactants, antifoaming agents, and small amounts of organic solvent to accelerate development.

An aqueous developing solution used may be a developing solution composed of water and an aqueous alkali solution or one or more different organic solvents. As examples of bases for aqueous alkali solutions other than those already referred to above there may be mentioned sodium metasilicate, tetramethylammonium hydroxide, ethanolamine, ethylenediamine, diethylenetriamine, 2-amino-2-hydroxymethyl-1,3-propanediol, 1,3-diaminopropanol-2 and morpholine. The pH of the developing solution is preferably in a range allowing sufficient development of the resist, and is preferably pH 8-12 and more preferably pH 9-10.

Examples of organic solvents include acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether and diethyleneglycol monobutyl ether. These may be used as single compounds or as combinations of two or more compounds. The concentration of the organic solvent is normally preferred to be 2-90 wt %, and the temperature may be adjusted as appropriate for the developing property. The aqueous developing solution may also contain small amounts of added surfactants, antifoaming agents and the like.

Examples of organic solvent-based developing solutions using organic solvents alone include 1,1,1-trichloroethane, N-methylpyrrolidone, N,N-dimethylformamide, cyclohexanone, methyl isobutyl ketone and γ-butyrolactone. Water is preferably added to these organic solvent-based developing solutions in a range of 1-20 wt % for anti-flammability.

Post-development treatment may consist of heating at about 60-250° C. or exposure at about 0.2-10 J/cm$^2$ if necessary for further curing of the resist pattern.

The method of producing a printed wiring board according to the invention will now be explained.

The method of producing a printed wiring board according to the invention is a process wherein a circuit-forming board having a resist pattern formed by the method of forming a resist pattern of the invention is etched or plated to form a conductor pattern.

The etching or plating of the circuit-forming board is carried out on the conductive layer of the circuit-forming board using the formed resist pattern as a mask. The etching solution for etching may be a cupric chloride solution, ferric chloride solution, alkali etching solution or hydrogen peroxide etching solution. A ferric chloride solution is preferred among those mentioned above from the viewpoint of achieving a satisfactory etch factor. The plating process used for plating may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating.

After completion of the etching or plating, the resist pattern is released, for example, with an aqueous solution of even stronger alkalinity than the aqueous alkali solution used for development. The strongly alkaline aqueous solution used here may be, for example, a 1-10 wt % sodium hydroxide aqueous solution or a 1-10 wt % potassium hydroxide aqueous solution. The releasing system may be, for example, a dipping system, spraying system or the like, and a dipping or spraying system may be used either alone or in combination. A printed wiring board is obtained in the manner described above.

The embodiments described above are preferred embodiments of the invention, but the invention is not limited thereto.

EXAMPLES

The present invention will now be explained in greater detail through the following examples, with the understanding that these examples are in no way limitative on the invention.

[Synthesis of Binder Polymer (Component (A)) 1]

In a flask equipped with a stirrer, reflux condenser, thermometer, dropping funnel and nitrogen gas inlet tube, there was added 500 g of a mixture of methylcellosolve and toluene in a weight ratio of 3:2, and the obtained mixture was stirred while blowing in nitrogen gas and heated to 80° C. Separately, there was prepared a solution comprising a mixture of 150 g of methacrylic acid, 175 g of cyclohexyl methacrylate, 175 g of styrene and 12.5 g of azobisisobutyronitrile as copolymerizing monomers (hereinafter referred to as "solution (a)". Solution (a) was added dropwise over a period of 4 hours to a previously prepared mixture of methylcellosolve and toluene in a weight ratio of 3:2, and the obtained mixture was warmed at 80° C. for 2 hours while stirring. Also, a solution of 1.0 g of azobisisobutyronitrile dissolved in 250 g of a mixture of methylcellosolve and toluene in a weight ratio of 3:2 was further added dropwise over a period of 10 minutes. After keeping the dropped solution at 80° C. for 3 hours while stirring, it was heated to 90° C. over a period of 30 minutes. The solution was warmed at 90° C. for 2 hours, and then cooled to obtain a binder polymer (A-1).

The nonvolatile portion (solid portion) of the binder polymer (A-1) was 46 wt %, and the weight-average molecular weight was 40000. The weight-average molecular weight was measured by gel permeation chromatography, and calculation was performed using a standard polystyrene calibration curve. The GPC conditions were as follows.

Pump: Hitachi L-6000 (trade name of Hitachi, Ltd.).
Column: Gelpack GL-R420+Gelpack GL-R430+Gelpack GL-R440M (total: 3) (all trade names of Hitachi Chemical Co., Ltd.)
Eluent: tetrahydrofuran
Measuring temperature: 40° C.
Flow rate: 2.05 mL/min
Detector: Hitachi L-3300 RI (trade name of Hitachi, Ltd.).

Binder polymers (A-2) to (A-6) were synthesized by the same method as the synthesis method for binder polymer (A-1) described above, using the compositions listed in Table 1.

TABLE 1

|  |  | A-1 | A-2 | A-3 | A-4 | A-5 | A-6 |
|---|---|---|---|---|---|---|---|
| Binder polymer (mass ratio) | Methacrylic acid | 30 | 30 | 30 | 30 | 30 | 30 |
|  | Styrene | 35 | 40 | 10 | 60 | 35 | 35 |
|  | Cyclohexyl methacrylate | 35 | 30 | 60 | 10 | — | — |
|  | Methyl methacrylate | — | — | — | — | — | 35 |
|  | Dodecyl methacrylate | — | — | — | — | 35 | — |
| Weight-average molecular weight |  | 40000 | 40000 | 40000 | 40000 | 40000 | 40000 |

*Methyl cellosolve/toluene (3/2) solution (solid content: 47.8%)

[Synthesis of Binder Polymer (Component (A)) 2]

In a flask equipped with a stirrer, reflux condenser, thermometer, dropping funnel and nitrogen gas inlet tube there was added 450 g of a mixture of methylcellosolve and toluene at a weight ratio of 3:2, and the obtained mixture was stirred while blowing in nitrogen gas and heated to 80° C. Separately, there was prepared a solution comprising a mixture of 150 g of methacrylic acid, 175 g of tetrahydropyranyl methacrylate, 175 g of styrene and 9.0 g of azobisisobutyronitrile as copolymerizing monomers (hereinafter referred to as "solution (b)"). Solution (b) was added dropwise over a period of 4 hours to a previously prepared mixture of propyleneglycol monomethyl ether and toluene in a weight ratio of 3:2, and the obtained mixture was warmed for 2 hours while stirring at 80° C. Also, a solution of 1.2 g of azobisisobutyronitrile dissolved in 100 g of a mixture of propyleneglycol monomethyl ether and toluene in a weight ratio of 3:2 was added dropwise over a period of 10 minutes. After keeping the dropped solution at 80° C. for 3 hours while stirring, it was heated to 90° C. over a period of 30 minutes. The solution was warmed at 90° C. for 2 hours, and then cooled to obtain a binder polymer (A-7).

The nonvolatile portion (solid portion) of the binder polymer (A-7) was 47.8 wt %, and the weight-average molecular weight was 41000.

Binder polymers (A-8) to (A-12) were synthesized by the same method as the synthesis method for binder polymer (A-7) described above, using the compositions listed in Table 2.

TABLE 2

|  |  | A-7 | A-8 | A-9 | A-10 | A-11 | A-12 |
|---|---|---|---|---|---|---|---|
| Binder polymer (mass ratio) | Methacrylic acid | 30 | 25 | 30 | 30 | 30 | 30 |
|  | Styrene | 35 | 45 | 35 | 35 | 35 | 35 |
|  | Cyclohexyl methacrylate | — | — | — | — | — | 35 |
|  | Tetrahydropyranyl methacrylate | 35 | 30 | — | — | — | — |
|  | Adamantyl methacrylate | — | — | 35 | — | — | — |

TABLE 2-continued

|  | | A-7 | A-8 | A-9 | A-10 | A-11 | A-12 |
|---|---|---|---|---|---|---|---|
| | Isobornyl methacrylate | — | — | — | 35 | — | — |
| | Dicyclopentanyl methacrylate | — | — | — | — | 35 | — |
| Weight-average molecular weight | | 41000 | 36000 | 37000 | 55000 | 52000 | 40000 |

*Propylene glycol monomethyl ether/toluene (3/2) solution (solid content: 47.8%)

(Preparation of Photosensitive Resin Composition)

The binder polymers (A-1) to (A-6) were combined with the following materials in the weight ratios listed in Table 3, to prepare photosensitive resin composition solutions for Examples 1-3 and Comparative Examples 1-3. The binder polymers (A-7) to (A-12) were combined with the following materials in the weight ratios listed in Table 4, to prepare photosensitive resin composition solutions for Examples 4-9.

<Photopolymerizing Compound (Component (B))>

B-1: 2,2-bis(4-(Methacryloxypentaethoxy)phenyl)propane (trade name: FA-321M by Hitachi Chemical Co., Ltd.)

B-2: Compound represented by formula (V), vinyl compound wherein $R^{11}=R^{12}=$methyl, m1+m2=4 (average value) and n1=12 (average value) (FA-023M, trade name of Hitachi Chemical Co., Ltd.).

B-3: γ-Chloro-β-hydroxypropyl-β-methacryloyloxyethyl-o-phthalate ("FA-MECH", trade name of Hitachi Chemical Co., Ltd.)

B-4: Compound represented by formula (XI), vinyl compound wherein $R^{11}=R^{12}=$methyl, n2+n3=12 (average value) and m3=6 (average value) (FA-024M, trade name of Hitachi Chemical Co., Ltd.).

B-5: 4-normal-Nonylphenoxyoctaethyleneglycol acrylate (trade name: "M-114" by ToaGosei Co., Ltd.)

<Photopolymerization Initiator (Component (C))>

C-1: 2,2'-bis(2-Chlorophenyl)-4,4',5,5'-tetraphenylbisimidazole (trade name: "BCIM" by Hampford)

<Sensitizing Dye (Component (D))>

D-1: 9,10-Dibutoxyanthracene (trade name: "DBA" by Kawasaki Kasei Chemicals, Ltd., maximum absorption wavelengths [λn]=368 nm, 388 nm, 410 nm)

<(E) Coloring Agent (Amine Compound)>

E-1: Leuco crystal violet (Yamada Kagaku Co., Ltd.)

<Dye>

Malachite green (Osaka Organic Chemical Industry, Ltd.)

<Solvent>

Acetone

Toluene

Methanol

TABLE 3

| | | Example 1 | Example 2 | Example 3 | Comp. Ex. 1 | Comp. Ex. 2 | Comp. Ex. 3 |
|---|---|---|---|---|---|---|---|
| Component (A) | A-1 | 50 | — | — | — | — | — |
| | A-2 | — | 50 | — | — | — | — |
| | A-3 | — | — | — | 50 | — | — |
| | A-4 | — | — | 50 | — | — | — |
| | A-5 | — | — | — | — | 50 | — |
| | A-6 | — | — | — | — | — | 50 |
| Component (B) | B-1 | 30 | 30 | 30 | 30 | 30 | 30 |
| | B-2 | 10 | 10 | 10 | 10 | 10 | 10 |
| | B-3 | 10 | 10 | 10 | 10 | 10 | 10 |
| Component (C) | C-1 | 3.7 | 3.7 | 3.7 | 3.7 | 3.7 | 3.7 |
| Component (D) | D-1 | 0.8 | 0.8 | 0.8 | 0.8 | 0.8 | 0.8 |
| Component (E) | E-1 | 0.4 | 0.4 | 0.4 | 0.4 | 0.4 | 0.4 |
| Dye | Malachite green | 0.03 | 0.03 | 0.03 | 0.03 | 0.03 | 0.03 |
| Solvent | Acetone | 9 | 9 | 9 | 9 | 9 | 9 |
| | Toluene | 5 | 5 | 5 | 5 | 5 | 5 |
| | Methanol | 5 | 5 | 5 | 5 | 5 | 5 |

Component (A) represented as solid content, other components as mass ratio.

TABLE 4

| | | Example 4 | Example 5 | Example 6 | Example 7 | Example 8 | Example 9 |
|---|---|---|---|---|---|---|---|
| Component (A) | A-7 | 50 | — | — | — | — | — |
| | A-8 | — | 50 | — | — | — | — |
| | A-9 | — | — | 50 | — | — | — |
| | A-10 | — | — | — | 50 | — | — |
| | A-11 | — | — | — | — | 50 | — |
| | A-12 | — | — | — | — | — | 50 |
| Component (B) | B-1 | 25 | 25 | 25 | 25 | 25 | 25 |
| | B-4 | 15 | 15 | 15 | 15 | 15 | 15 |
| | B-5 | 10 | 10 | 10 | 10 | 10 | 10 |
| Component (C) | C-1 | 3.7 | 3.7 | 3.7 | 3.7 | 3.7 | 3.7 |
| Component (D) | D-1 | 0.7 | 0.7 | 0.7 | 0.7 | 0.7 | 0.7 |
| Component (E) | E-1 | 0.5 | 0.5 | 0.5 | 0.5 | 0.5 | 0.5 |

TABLE 4-continued

| | | Example 4 | Example 5 | Example 6 | Example 7 | Example 8 | Example 9 |
|---|---|---|---|---|---|---|---|
| Dye | Malachite green | 0.03 | 0.03 | 0.03 | 0.03 | 0.03 | 0.03 |
| Solvent | Acetone | 5 | 5 | 5 | 5 | 5 | 5 |
| | Toluene | 9 | 9 | 9 | 9 | 9 | 9 |
| | Methanol | 5 | 5 | 5 | 5 | 5 | 5 |

Component (A) represented as solid content, other components as mass ratio.

(Fabrication of Photosensitive Elements)

A solution of each obtained photosensitive resin composition was evenly coated onto a 16 μm-thick polyethylene terephthalate film as the support film. Next, a hot air convection drier was used for drying at 70° C. and 110° C. to form a photosensitive resin composition layer with a post-drying thickness of 25 μm. Next, a protective film was laminated on the photosensitive resin composition layer by roll pressing, to obtain a photosensitive element for each of Examples 1-9 and Comparative Examples 1-3.

(Fabrication of Test Pieces)

Next, the copper surface of a copper-clad laminate (trade name: MCL-E-67 by Hitachi Chemical Co., Ltd.), which was a glass epoxy material laminated on both sides with copper foil (35 mm thickness), was polished using a polishing machine with a #600-equivalent brush (Sankei Co., Ltd.), and after cleaning with water, it was dried with an air stream to obtain a copper-clad laminate (board). The copper-clad laminate was then heated to 80° C., the protective film of each photosensitive element was removed while bonding each photosensitive resin composition layer onto the surface of the copper-clad laminate, and lamination (layering) was performed at 120° C. under a pressure of 4 kgf/cm$^2$ to fabricate test pieces.

(Evaluation of Properties)

<Photosensitivity>

Each photosensitive element-laminated copper-clad laminate was cooled, and upon reaching 23° C., there were contact bonded onto the support film a phototool having a 41-step tablet with a density range of 0.00-2.00, a density step of 0.05, a tablet size of 20 mm×187 mm and a step size of 3 mm×12 mm. A DE-1AH (trade name) direct imager by Hitachi Via Mechanics, Ltd., having a 405 nm violet laser diode as the light source, was used for exposure (drawing) onto the photosensitive resin composition layer through the phototool and support film with a prescribed exposure dose. The measurement of illuminance was performed using an ultraviolet illuminometer employing a 405 nm-corresponding probe (trade name: UIT-150 by Ushio Inc.).

Next, the support film was released and 1 wt % aqueous sodium carbonate was sprayed at 30° C. for 24 seconds to remove the unexposed sections of the photosensitive resin composition layer for development. The number of steps of the step tablet of the photocured film remaining on the copper-clad laminate was then counted. The exposure dose for 11 steps of the step tablet was evaluated as the photosensitivity. A smaller exposure dose indicates higher photosensitivity. The obtained results are shown in Tables 5 and 6.

<Adhesiveness>

The adhesiveness was evaluated by exposure using a phototool having a wiring pattern with a line width/space width ratio of 10/10-22/22 (units: μm) as the negative for adhesiveness evaluation. The index for evaluation of the adhesiveness was the smallest value (units: μm) for the line width/space width which allowed clean removal of the unexposed sections by developing treatment after exposure formed lines without waviness or breaking. The exposure dose was adjusted so that the number of steps remaining of the step tablet after developing treatment was 9, 11 or 13, and the adhesiveness at each exposure dose was evaluated. Small values are desirable for the adhesiveness evaluation. The obtained results are shown in Tables 6 and 7.

<Resolution (Removability)>

The resolution was evaluated by exposure at a prescribed exposure dose using a phototool having a wiring pattern with a line width/space width ratio of 400/10-400/22 (units: μm) as the negative for resolution evaluation. The index for evaluation of the resolution was the smallest value (units: μm) for the space width between lines where the unexposed section had been cleanly removed from the resist pattern formed by development after exposure. The exposure dose was adjusted so that the number of steps remaining of the step tablet after developing treatment was 9, 11 or 13, and the resolution at each exposure dose was evaluated. Small values are desirable for the resolution evaluation. The obtained results are shown in Tables 6 and 7.

<Release Property>

The release property was evaluated by the following method. First, photosensitive resin composition layers according to each of the examples and comparative examples were formed on copper-clad laminates, and exposure and development of each photosensitive resin composition layer was performed at the prescribed exposure dose to fabricate photocured films with sizes of 40 mm×50 mm. A 3% sodium hydroxide aqueous solution was also used for release. The index for evaluation of the release property was the release time, measured as the time to complete release and removal of the photocured film from the copper-clad laminate. The exposure dose was the exposure dose such that 11 steps remained of the step tablet after developing treatment. The conditions for the releasing process are shown in Table 5. The obtained results are shown in Tables 6 and 7.

TABLE 5

| Process | Conditions |
|---|---|
| Exposure | ST: Exposure dose to obtain 11/41 steps |
| Development | Developing solution: 1% Na$_2$CO$_3$, Solution temp: 30° C., Spray-type |
| Release | Release solution: 3% NaOH, Solution temp: 50° C., Dip stirring |

TABLE 6

|  |  | Example 1 | Example 2 | Example 3 | Comp. Ex. 1 | Comp. Ex. 2 | Comp. Ex. 3 |
|---|---|---|---|---|---|---|---|
| Photosensitivity (mJ/cm$^2$) | | 50 | 50 | 50 | 60 | 70 | 50 |
| Adhesion (μm) | 9 steps | 20 | 20 | 20 | Unmeasurable | >22 | >22 |
| | 11 steps | 18 | 18 | 16 | Unmeasurable | >22 | 20 |
| | 13 steps | 12 | 12 | 15 | Unmeasurable | 20 | 16 |
| Resolution (μm) | 9 steps | 10 | 10 | 10 | Unmeasurable | 10 | 10 |
| | 11 steps | 10 | 10 | 10 | Unmeasurable | 10 | 10 |
| | 13 steps | 12 | 10 | 10 | Unmeasurable | 12 | 12 |
| Release property (sec) | | 90 | 90 | 130 | 75 | 52 | 80 |

TABLE 7

|  |  | Example 4 | Example 5 | Example 6 | Example 7 | Example 8 | Example 9 |
|---|---|---|---|---|---|---|---|
| Photosensitivity (mJ/cm$^2$) | | 72 | 75 | 70 | 65 | 66 | 50 |
| Adhesion (μm) | 9 steps | 20 | 20 | 20 | 20 | 20 | 20 |
| | 11 steps | 18 | 18 | 18 | 18 | 18 | 18 |
| | 13 steps | 14 | 14 | 12 | 14 | 14 | 12 |
| Resolution (μm) | 9 steps | 10 | 10 | 10 | 10 | 10 | 10 |
| | 11 steps | 10 | 10 | 10 | 10 | 10 | 10 |
| | 13 steps | 12 | 12 | 12 | 12 | 12 | 12 |
| Release property (sec) | | 86 | 103 | 111 | 120 | 125 | 90 |

<Evaluation Results>

As seen in Table 4, the photosensitivity, adhesiveness and resolution were excellent in Examples 1 and 2 and the release time was suitably short, in a satisfactory balance. In Example 3, the release time was longer but the photosensitivity, adhesiveness and resolution were excellent. In Comparative Example 1, on the other hand, the adhesiveness was especially poor, and no resist pattern could be formed. In Comparative Example 2, the resolution and release property were satisfactory but the adhesiveness was inferior. In Comparative Example 3, the release property and resolution were excellent but the adhesiveness was especially poor.

As seen in Table 7, the photosensitivity, adhesiveness and resolution were excellent in Examples 4 and 5 and Example 9, and the release time was suitably short, in a satisfactory balance. In each of Examples 6-8, the release time was longer but the photosensitivity, adhesiveness and resolution were excellent.

Industrial Applicability

According to the invention it is possible to provide a photosensitive resin composition for formation of a resist pattern that is more satisfactory than the conventional art in terms of sensitivity, resolution and adhesiveness.

The invention claimed is:

1. A photosensitive resin composition comprising:
  (A) 100 parts by weight of a binder polymer having 10-65 parts by weight of a divalent group represented by the following formula (I), 5-55 parts by weight of a divalent group represented by the following formula (II) and 15-50 parts by weight of a divalent group represented by the following formula (III);
  (B) a photopolymerizing compound;
  (C) a photopolymerization initiator; and
  (D) at least one sensitizing dye with a maximum absorption wavelength of 370-420 nm selected from the group consisting of pyrazolines, anthracenes, coumarins, xanthones, triazoles, triazines, thiophenes and naphthalimides,

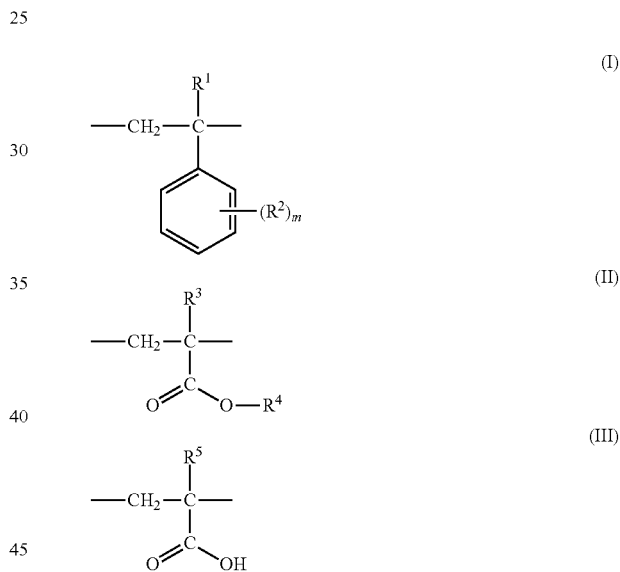

wherein, in formula (I), formula (II) and formula (III), $R^1$, $R^3$ and $R^5$ each independently represent hydrogen or a methyl group, $R^2$ represents C1-3 alkyl, C1-3 alkoxy, hydroxyl, amino or a halogen atom, $R^4$ represents an optionally substituted alicyclic hydrocarbon, optionally substituted aromatic hydrocarbon or optionally substituted heterocyclic group, m represents an integer of 0-5, and when m is 2-5, the multiple $R^2$ groups may be the same or different.

2. The photosensitive resin composition according to claim 1, wherein $R^4$ is a monovalent group represented by the following formula (IV),

wherein, in formula (IV), $R^6$ represents hydroxyl, C1-12 alkyl or C1-12 hydroxyalkyl, n represents an integer of 0-5, and when n is 2-5 the multiple $R^6$ groups may be the same or different.

3. The photosensitive resin composition according to claim 1, wherein $R^4$ is at least one group selected from the group consisting of monovalent groups represented by the following formulas (V), (VI), (VII) and (VIII),

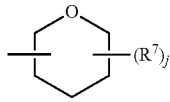   (V)

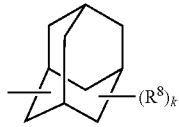   (VI)

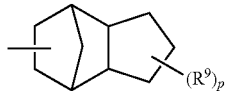   (VII)

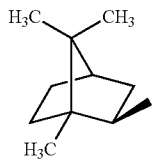   (VIII)

wherein, in formulas (V), (VI), (VII) and (VIII), $R^7$, $R^8$ and $R^9$ each independently represent hydroxyl, C1-12 alkyl or C1-12 hydroxyalkyl, j represents an integer of 0-4, k and p represent integers of 0-9, and when j, k or p is 2 or greater, the multiple $R^7$, $R^8$ or $R^9$ groups may be the same or different.

4. The photosensitive resin composition according to claim 1, wherein the (C) photopolymerization initiator comprises a hexaarylbiimidazole derivative.

5. The photosensitive resin composition according to claim 1, further comprising (E) an amine-based compound.

6. A photosensitive element comprising:
   (a) a support film; and
   (b) a photosensitive resin composition layer containing the photosensitive resin composition according to claim 1, wherein the photosensitive resin composition layer is formed on the support film.

7. A method of forming a resist pattern, the method comprising the steps of:
   (a) laminating a photosensitive resin composition layer containing the photosensitive resin composition according to claim 1 on a circuit-forming board;
   (b) exposing at least one prescribed section of the photosensitive resin composition layer to irradiation with active light rays, wherein exposure to irradiation photocures the at least one exposed prescribed section; and
   (c) removing at least one unexposed section of the photosensitive resin composition layer from the circuit-forming board on which the photosensitive resin composition layer has been laminated.

8. A method of producing a printed wiring board, the method comprising the steps of:
   (a) providing a circuit-forming board having a resist pattern formed by the method of claim 7;
   (b) etching or plating the circuit-forming board, wherein the etching or plating forms a conductor pattern.

* * * * *